United States Patent
Enomoto

(10) Patent No.: US 10,031,416 B2
(45) Date of Patent: Jul. 24, 2018

(54) REAGENT FOR ENHANCING GENERATION OF CHEMICAL SPECIES

(71) Applicant: TOYO GOSEI CO., LTD., Ichikawa-shi, Chiba (JP)

(72) Inventor: Satoshi Enomoto, Ichikawa (JP)

(73) Assignees: Toyo Gosei Co., Ltd., Ichikawa-Shi, Chiba (JP); Osaka University, Suita-Shi, Osaka (JP)

( * ) Notice: Subject to any disclaimer, the term of this patent is extended or adjusted under 35 U.S.C. 154(b) by 0 days.

(21) Appl. No.: 14/909,051

(22) PCT Filed: Aug. 7, 2014

(86) PCT No.: PCT/JP2014/004119
§ 371 (c)(1),
(2) Date: Jan. 29, 2016

(87) PCT Pub. No.: WO2015/019616
PCT Pub. Date: Feb. 12, 2015

(65) Prior Publication Data
US 2016/0187773 A1 Jun. 30, 2016

Related U.S. Application Data

(60) Provisional application No. 61/863,354, filed on Aug. 7, 2013.

(51) Int. Cl.
G03F 7/039 (2006.01)
G06F 7/20 (2006.01)
G03F 7/004 (2006.01)
C08F 220/28 (2006.01)
G03F 7/20 (2006.01)

(52) U.S. Cl.
CPC ......... G03F 7/0045 (2013.01); C08F 220/28 (2013.01); G03F 7/0397 (2013.01); G03F 7/203 (2013.01); G03F 7/2022 (2013.01); C08F 2220/283 (2013.01)

(58) Field of Classification Search
None
See application file for complete search history.

(56) References Cited

U.S. PATENT DOCUMENTS 3,503,993 A * 3/1970 Blume ................. C07D 319/06
549/274
3,622,848 A * 11/1971 Hendrix .................. H01G 4/18
264/479

(Continued)

FOREIGN PATENT DOCUMENTS

CN 102803304 A 11/2012
EP 2526125 A1 11/2012

(Continued)

OTHER PUBLICATIONS

Thevenet et al. "An efficient photoinduced deprotection of aromatic acetals and ketals", Helvet. Chim. Acta., vol. 94 pp. 331-346 (2011).*

(Continued)

*Primary Examiner* — Martin J Angebranndt
(74) *Attorney, Agent, or Firm* — TraskBritt, P.C.

(57) ABSTRACT

A reagent that enhances acid generation of a photoacid generator and composition containing such reagent is disclosed.

19 Claims, 1 Drawing Sheet

(56) References Cited

U.S. PATENT DOCUMENTS

| | | | |
|---|---|---|---|
| 4,190,602 A | 2/1980 | Brunisholz et al. | |
| 4,439,516 A * | 3/1984 | Cernigliaro | G03F 7/0233 430/166 |
| 4,734,444 A * | 3/1988 | Henne | C08G 59/687 430/280.1 |
| 4,931,380 A * | 6/1990 | Owens | G03F 7/2022 430/296 |
| 5,049,478 A * | 9/1991 | Koch | G03F 7/16 156/243 |
| 5,112,723 A * | 5/1992 | Huemmer | G03F 7/032 430/281.1 |
| 5,262,281 A * | 11/1993 | Bauer | G03F 7/0045 430/312 |
| 5,576,143 A * | 11/1996 | Aoai | G03F 7/0045 430/270.1 |
| 5,633,103 A * | 5/1997 | DeMarco | G03F 1/26 356/399 |
| 5,900,472 A * | 5/1999 | Fan | C07C 69/76 427/496 |
| 5,914,807 A | 6/1999 | Downing | |
| 5,939,234 A * | 8/1999 | Yamanaka | G03F 7/0045 430/170 |
| 6,048,667 A | 4/2000 | Eldin et al. | |
| 7,102,802 B1 | 9/2006 | Erben et al. | |
| 7,851,252 B2 | 12/2010 | Nealey et al. | |
| 9,068,024 B2 * | 6/2015 | Enomoto | C08F 2/50 |
| 9,488,915 B2 | 11/2016 | Miyazawa | |
| 9,567,277 B2 | 2/2017 | Enomoto | |
| 2003/0064320 A1 * | 4/2003 | Hanabata | G03F 7/0382 430/270.1 |
| 2003/0176519 A1 | 9/2003 | Crivello | |
| 2005/0119433 A1 | 6/2005 | Sakayori | |
| 2005/0264737 A1 | 12/2005 | Kataoka et al. | |
| 2006/0040208 A1 * | 2/2006 | Tarutani | G03F 7/0045 430/270.1 |
| 2006/0103804 A1 | 5/2006 | Hirosawa | |
| 2008/0230722 A1 * | 9/2008 | Elian | B82Y 10/00 250/492.2 |
| 2010/0009289 A1 * | 1/2010 | Fedynyshyn | G03F 7/0045 430/280.1 |
| 2010/0029869 A1 * | 2/2010 | Morini | C08F 10/02 526/119 |
| 2010/0047709 A1 * | 2/2010 | Echigo | C07C 37/20 430/270.1 |
| 2010/0272925 A1 | 10/2010 | Goetz et al. | |
| 2010/0305336 A1 * | 12/2010 | Loccufier | C07C 67/14 549/27 |
| 2011/0008732 A1 | 1/2011 | Ober et al. | |
| 2011/0095229 A1 | 4/2011 | Lee et al. | |
| 2011/0102720 A1 | 5/2011 | Mizusaki et al. | |
| 2011/0196169 A1 * | 8/2011 | Knebel | C07C 67/08 560/140 |
| 2011/0250540 A1 | 10/2011 | Huang et al. | |
| 2011/0300482 A1 * | 12/2011 | Suzuki | C07C 381/12 430/270.1 |
| 2012/0040288 A1 | 2/2012 | Adams et al. | |
| 2013/0105297 A1 * | 5/2013 | Johnstone | C08F 2/50 204/157.93 |
| 2013/0169916 A1 | 7/2013 | Mizusaki et al. | |
| 2013/0324633 A1 * | 12/2013 | Enomoto | C07C 69/54 522/34 |
| 2014/0066539 A1 * | 3/2014 | Tobing | C09J 153/00 522/46 |
| 2014/0139794 A1 | 5/2014 | Ohnishi et al. | |
| 2014/0148566 A1 * | 5/2014 | Denkwitz | C08F 10/06 526/209 |
| 2014/0168586 A1 * | 6/2014 | Mizusaki | C09K 19/2014 349/123 |
| 2014/0193752 A1 | 7/2014 | Brainard et al. | |
| 2014/0333879 A1 | 11/2014 | Noma et al. | |
| 2014/0361275 A1 | 12/2014 | Osaki et al. | |
| 2015/0060728 A1 * | 3/2015 | Enomoto | C07C 33/24 252/183.11 |
| 2015/0099893 A1 | 4/2015 | Enomoto | |
| 2015/0140493 A1 * | 5/2015 | Enomoto | C07D 317/22 430/322 |
| 2015/0141687 A1 | 5/2015 | Miyazawa | |
| 2015/0241779 A1 * | 8/2015 | Enomoto | G03F 7/0045 430/270.1 |
| 2015/0376438 A1 * | 12/2015 | Enomoto | H01L 21/02348 522/154 |
| 2016/0004160 A1 | 1/2016 | Tagawa et al. | |
| 2016/0070165 A1 | 3/2016 | Enomoto | |
| 2016/0147144 A1 | 5/2016 | Enomoto | |
| 2016/0159953 A1 | 6/2016 | Enomoto et al. | |
| 2016/0187773 A1 | 6/2016 | Enomoto | |
| 2016/0194300 A1 | 7/2016 | Enomoto | |
| 2016/0195808 A1 | 7/2016 | Enomoto | |
| 2016/0223904 A1 | 8/2016 | Enomoto | |
| 2016/0225611 A1 | 8/2016 | Enomoto et al. | |
| 2016/0259245 A1 | 9/2016 | Enomoto et al. | |

FOREIGN PATENT DOCUMENTS

| | | | |
|---|---|---|---|
| GB | 2476976 | * | 7/2011 |
| JP | 02180909 A | | 7/1990 |
| JP | 02-305434 | * | 12/1990 |
| JP | 04305574 A | | 10/1992 |
| JP | 05-310635 | * | 11/1993 |
| JP | 05310635 A | | 11/1993 |
| JP | 06-168870 | * | 6/1994 |
| JP | 08-053373 | * | 2/1996 |
| JP | 08-166670 | * | 6/1996 |
| JP | 11509329 A | | 8/1999 |
| JP | 2002527795 A | | 8/2002 |
| JP | 2005082679 A | | 3/2005 |
| JP | 2007031650 A | | 2/2007 |
| JP | 2008133448 A | | 6/2008 |
| JP | 2009038150 A | | 2/2009 |
| JP | 2009217253 A | | 9/2009 |
| JP | 2010059067 A | | 3/2010 |
| JP | 2010-77377 | | 4/2010 |
| JP | 2011256390 A | | 12/2011 |
| JP | 4955646 B2 | | 6/2012 |
| JP | 2013-031125 | | 2/2013 |
| JP | 2013517345 A | | 5/2013 |
| JP | 2013-211479 | | 10/2013 |
| JP | 2014511849 A | | 5/2014 |
| WO | 00/22481 | | 4/2000 |
| WO | 2004107051 A2 | | 12/2004 |
| WO | 2009047152 A1 | | 4/2009 |
| WO | 2011086389 A1 | | 7/2011 |
| WO | 2012032857 A1 | | 3/2012 |
| WO | 2012105479 A1 | | 8/2012 |
| WO | 2012135286 A2 | | 10/2012 |
| WO | 2014129556 A1 | | 8/2014 |
| WO | 2015019616 A1 | | 2/2015 |
| WO | 2015049871 A1 | | 4/2015 |
| WO | 2015052914 A1 | | 4/2015 |

OTHER PUBLICATIONS

Abdoul-Rasoul et al., "Photochemical and thermal cationic polymerizations promoted by free radical initiators", Poly. vol. 19 pp. 1219-1222 (Oct. 1978).*
Henderson et al., "Profile improvement in e-beam exposed resist patterns", IBM Tech. Discl. Bull., vol. 24(11A) pp. 5549 (Apr. 1982).*
Nagahara et al., Methods to Improve Radiation Sensitivity of Chemically Amplified Resists by Using Chain Reactions of Acid Generation, In Advances in Resist Technology and Processing XVII, 2000, Francis M. Houlihan, Editor, Proceedings of SPIE, vol. 3999, pp. 386-394.
PCT International Search Report, PCT/JP2014/004119, dated Nov. 11, 2014.
PCT International Written Opinion, PCT/JP2014/004119, dated Nov. 11, 2014.
Pappas et al., Photoinitiation of cationic polymerization, J. Poly. Sci., Poly. Chem., 1984, pp. 77-84, vol. 22.

(56) References Cited

OTHER PUBLICATIONS

Wagner et al., Rate constants for degenerate hydrogen atom exchange, J. Phys. Chem, 1993, pp. 331-346, vol. 94.
Crivello et al., Benzyl alcohols as accelerators in the photoinitiated cationic, J. Poly. Sci., Poly. Chem., 2002, pp. 2298-2309, vol. 40.
Enomoto et al., Surface Patterned Graft Copolymerization of Hydrophilic Monomers onto Hydrophobic Polymer Film Upon UV Irradiation, Journal of Polymer Science, Part A: Polymer Chemistry, 2014, pp. 2288-2829, vol. 52.
Francesco et al., Abstract, A Direct Access to alpha-Diones from Oxalyl Chloride, Tetrahedron Letters, 1995, pp. 7305-7308, vol. 36, No. 40.

* cited by examiner

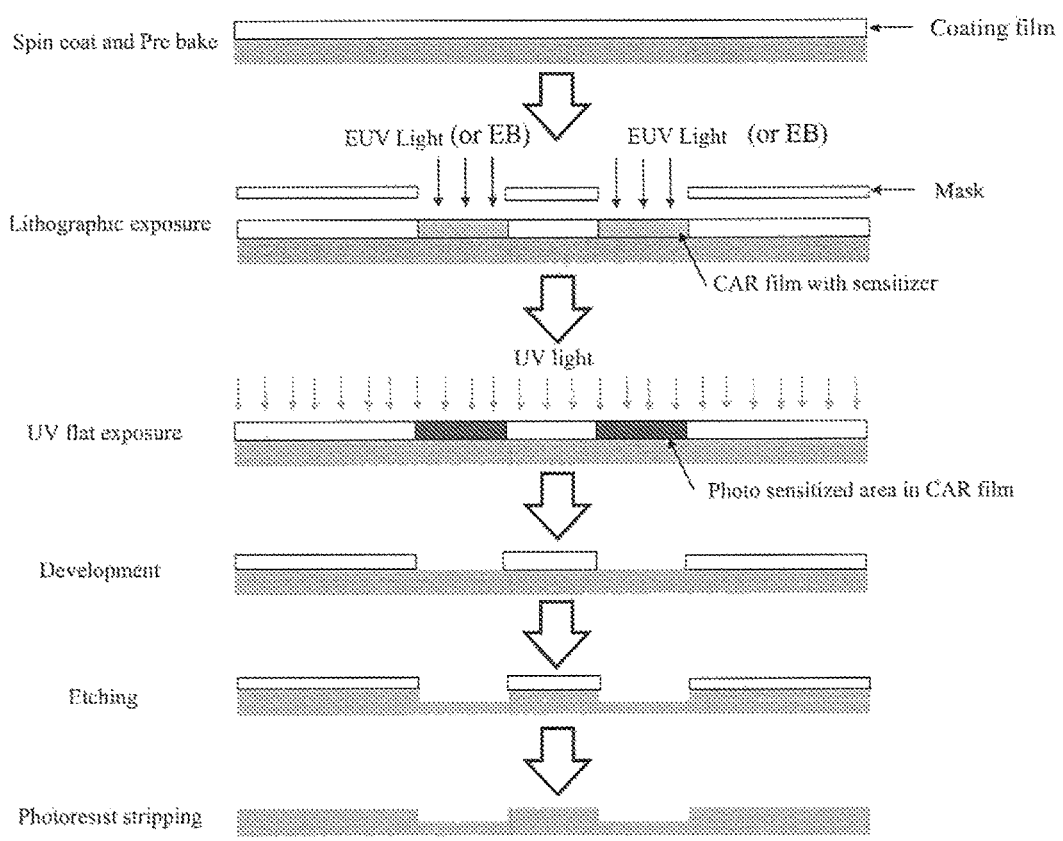

REAGENT FOR ENHANCING GENERATION OF CHEMICAL SPECIES

CROSS-REFERENCE TO RELATED APPLICATIONS

This application is a national phase entry under 35 U.S.C. § 371 of International Patent Application PCT/JP2014/004119, filed Aug. 7, 2014, designating the United States of America and Published in English as International Patent Publication WO 2015/019616 A1 on Feb. 12, 2015, which claims the benefit under Article 8 of the Patent Cooperation Treaty and under 35 U.S.C. § 119(e) to U.S. Provisional Patent Application Ser. No. 61/863,354 filed on Aug. 7, 2013, the disclosure of each of which is hereby incorporated herein in its entirety by this reference.

TECHNICAL FIELD

Several aspects of this disclosure relates to the fields of a reagent enhancing a generation of a chemical species such as acid and base. An intermediate formed from the reagent function as a photosensitizer.

BACKGROUND

Current high-resolution lithographic processes are based on chemically amplified resists (CARs) and are used to pattern features with dimensions less than 100 nm.

A method for forming pattern features with dimensions less than 100 nm is disclosed in U.S. Pat. No. 7,851,252 (filed on Feb. 17, 2009; issued Dec. 14, 2010), the disclosure of which is hereby incorporated herein in its entirety by this reference.

BRIEF SUMMARY

Reagents that enhance generation of a chemical species such as acid and a composition are disclosed herein. Typically, such reagent assists the generation of Brönsted acid or base from a precursor. Furthermore, such reagent can apply to the generation of Lewis acid and base. Typically, such reagent generates a ketone or aldehyde compound by reacting with a chemical species such as acid. More typically, such reagent has a protecting group for the carbonyl group of the ketone or aldehyde compound. The ketone or aldehyde compound is generated by deprotection reaction of the reagent by acid or base. The generated ketone or aldehyde compound acts as the sensitizer that enhances a generation of acid or base from the precursor by an irradiation of the ketone or aldehyde compound of which excited state can transfer its energy or electron to the precursor. The precursor generates the chemical species after receiving the energy or the electron from the excited state of the ketone or aldehyde compound. Since several sensitizers are required to have high electron donor character to enhance electron transfer to the precursor, such sensitizers have at least one electron-donating group on the aromatic ring such as an alkyl group, an alkoxy group, an alkyl amino and hydroxyl group, and an alkyl thio group.

For example, a composition containing a reagent that is to form such sensitizer, a precursor that is to form a chemical species, and a compound that is to react with the chemical species can be applied as photoresist to manufacturing of electronic devices such as a semiconductor device and an electro-optical device. For example, after a coating film of the composition is exposed to an excimer laser, an extreme ultraviolet (EUV) light and an electron beam (EB) are used in a first step. A chemical species generated in the coating film in the first step reacts with the reagent to form such sensitizer. In a second step, the coating film can be exposed to a light, which wavelength is longer than that of the EUV light, and a UV light, which wavelength is longer than 200 nm, or a visible light. In the second step, the generated sensitizer enhances a reaction from the precursor to form a chemical species. Typically, the chemical species that reacts with the reagent to form the sensitizer is identical with the chemical species that is formed from the precursor. Therefore, the sensitizer is generated even in the second step. In other words, the formation of the sensitizer is chemically amplified. The composition can be used as a chemically amplified photoresist containing a photoacid generator (PAG) and a resin containing a protective group, such as an ester and ether group, which is to decompose by reacting with acid generated from the PAG. The photoresist further contains a reagent having a protecting group of a carbonyl group, which is to react with acid generated from PAG to form a corresponding ketone or aldehyde compound. The ketone or aldehyde compound acts as a sensitizer enhancing the formation of an acid from PAG. A reaction of reagent with the generated acid results in chemically amplified formation of the ketone compound or aldehyde compound.

Triplet sensitizers, electron-accepting sensitizers, and energy-accepting sensitizers are also utilized for enhancing generation of a chemical species such as acid and base.

It is preferred that the reagent that is protected by an acid-dissociable group is not excited by a light irradiated in the second step. Alternatively, it is preferred that to attain the high resolution lithographic property of a sensitizer, an unexposure area in the first step is inactive for the light with which the reagent is irradiated in the second step. Therefore, it is preferred that the reagent is protected by a protective group such as an acyclic or cyclic acetal group, an acyclic or cyclic dithio acetal group, or an acyclic or cyclic monothio acetal group. Basically, such groups do not contribute to absorption of a light of which wavelength is equal to or longer than 300 nm.

A reagent relating to an aspect of this disclosure wherein a product is generated from the reagent and the product enhances a generation of a first chemical species from a precursor by a first reaction of the precursor.

A reagent relating to an aspect of this disclosure includes a first moiety including a protecting group and a second moiety that includes a pi-conjugated system. With regard to the reagent, it is preferred that a deprotection reaction of the first moiety occurs by a reaction of the first moiety with a first chemical species to form a product that absorbs a light, which wavelength is equal to or longer than 200 nm, the wavelength of the first moiety.

With regard to the reagent, it is preferred that the product enhances a generation of the first chemical species from a precursor.

With regard to the reagent, it is preferred that the first chemical species is acid.

With regard to the reagent, it is preferred that the product enhances the generation of the first chemical species from the precursor by absorbing a first light, which wavelength is a first wavelength and acting as a sensitizer.

With regard to the reagent, it is preferred that a second reaction of the reagent with a second chemical species results in the product.

With regard to the reagent, it is preferred that an irradiation of a precursor with a second light or a particle ray results in a second chemical species.

With regard to the reagent, it is preferred that the reagent itself does not enhance the generation of the first chemical species from the precursor.

With regard to the reagent, it is preferred that a second wavelength of the second light is equal to or shorter than 50 nm.

With regard to the reagent, it is preferred that the particle ray is an electron beam.

With regard to the reagent, it is preferred that the second chemical species is identical with the first chemical species.

With regard to the reagent, it is preferred that the first wavelength of the first light is longer than a second wavelength of the second light.

With regard to the reagent, it is preferred that the reagent is a polymer.

With regard to the reagent, it is preferred that the product acts as an electron-donating sensitizer.

A composition relating to an aspect of this disclosure includes any one of the above reagents and the precursor.

With regard to the composition, it is preferred that the composition further includes a resin or a compound, the molecular weight of which is greater than 2000.

With regard to the composition, it is preferred that the precursor generates the first chemical species by photosensitization of the product.

With regard to the composition, it is preferred that the product acts as a sensitizer by absorbing a first light.

With regard to the composition, it is preferred that a first wavelength of the first light is equal to or longer than 300 nm.

With regard to the composition, it is preferred that the precursor generates the first chemical species by absorbing a second light or a particle ray.

A composition relating to an aspect of this disclosure includes a reagent represented by one of formula (I) and a precursor that functions as a generation source of acid or base.

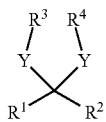

(1)

With regard to the reagent, it is preferred that: $R^1$ is a pi-conjugated system; $R^2$ is a hydrogen atom, an alkyl carbonyl group, an aryl carbonyl group, an alkyl group, an alkenyl group, an aralkyl group, an alkynyl group, an alkyl group containing a cyclic or poly cyclic moiety, or a substituent containing at least one atom other than a carbon atom and a hydrogen atom; each of $R^3$ and $R^4$ is an alkyl carbonyl group, an aryl carbonyl group, an alkyl group, an alkenyl group, an aralkyl group, an alkynyl group, an alkyl group containing a cyclic or poly cyclic moiety, or a substituent containing at least one atom other than a carbon atom and a hydrogen atom; and Y is an oxygen atom or sulfur atom.

With regard to the composition, it is preferred that $R^1$ is connected to $R^2$ through at least one bond.

With regard to the composition, it is preferred that $R^3$ is connected to $R^4$ through at least one bond.

With regard to the composition, it is preferred that the product is formed by a deprotection reaction of the reagent.

With regard to the composition, it is preferred that the reagent includes an acyclic or cyclic acetal group, an acyclic or cyclic dithio acetal group, and an acyclic or cyclic monothio acetal group.

With regard to the composition, it is preferred that the pi-conjugated system is an aromatic group.

With regard to the composition, it is preferred that the aromatic group is connected to at least one electron-donating group.

A method for manufacturing a device relating to an aspect of this disclosure comprises: applying a solution of any one of the above compositions to a substrate, such that a coating film including the composition is formed on the substrate; and a first irradiating of the coating film with at least one of a first electromagnetic ray and a first particle ray, such that a first portion of the coating film is irradiated with at least one of the electromagnetic ray and the particle ray, while a second portion of the coating film is not irradiated with the at least one of the electromagnetic ray and the particle ray; a second irradiating of the coating film with at least one of a UV light and a visible light; removing the first portion; and etching the substrate, such that a third portion of the substrate on which the first portion has been present is etched.

With regard to the reagent, it is preferred that the second reaction is a deprotection reaction of acetal of the reagent.

BRIEF DESCRIPTION OF THE DRAWING

In the drawing, which illustrates what is currently considered to be the best mode for carrying out the disclosure:

FIG. 1 shows fabrication processes of a device such as an integrated circuit (IC) using photoresist including an acid-generation enhancer.

DETAILED DESCRIPTION

EXPERIMENTAL PROCEDURES

Synthesis of
bis-(4-methoxy-phenyl)-dimethoxymethane
(Example 1)

2.0 g of 4,4'-dimethoxy-benzophenone, 0.05 g of bismuth (III) trifluoromethanesulfonate and 5.7 g of trimethyl orthofomate are dissolved in 5.0 g of methanol. The mixture is stirred at reflux temperature for 42 hours, after which the mixture is cooled to 25 degrees Celsius and further stirred after addition of 5% aqueous $NaHCO_3$ solution and then extracted with 30 g ethyl acetate and the organic phase is washed with water. Thereafter, ethyl acetate is distilled away and the resultants are purified by silica gel column chromatography (ethyl acetate:hexane=1:9), thereby obtaining 1.71 g of bis-(4-methoxy-phenyl)-dimethoxymethane.

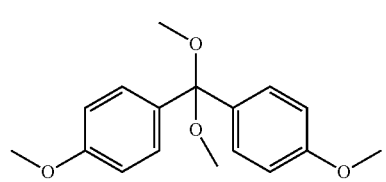

(2)

Example 1

Synthesis of 2,4-dimethoxy-4'-(2-vinyloxyethoxy)-benzophenone 2.00 g of 2,4-dimethoxy-4'-hydroxybenzophenone, 2.48 g of 2-chioroethyl vinyl ether and 3.21 g of potassium carbonate are dissolved in 12.0 g of DMF. The mixture is stirred at 110 degrees Celsius for 15 hours, after which the mixture is cooled to 25 degrees Celsius and further stirred after addition of 60.0 g of water and then extracted with 24.0 g of toluene and the organic phase is washed with water. Thereafter, toluene is distilled away, thereby obtaining 3.59 g of 2,4-dimethoxy-4'-(2-vinyloxyethoxy)-benzophenone.

Synthesis of 2,4-dimethoxy-4'-(2-hydroxyethoxy)-benzophenone 3.59 g of 2,4-dimethoxy-4'-(2-vinyloxyethoxy)-benzophenone, 0.28 g of pyridinium p-toluenesulfonate and 2.1 g of water are dissolved in 18.0 g of acetone. The mixture is stirred at 35 degrees Celsius for 12 hours, after which the mixture is further stirred after addition of 3% aqueous solution of sodium carbonate, and then extracted with 28.0 g ethyl acetate and the organic phase is washed with water. Thereafter, ethyl acetate is distilled away, thereby obtaining 3.04 g of 2,4-dimethoxy-4'-(2-hydroxyethoxy)-benzophenone.

Synthesis of 2,4-dimethoxy-4'-(2-methacryloxy-ethoxy)-benzophenone 2.8 g of 2,4-dimethoxy-4'-(2-hydroxyethoxy)-benzophenone and 1.4 g of methacrylic anhydride are dissolved in 20 g of tetrahydrofuran. 1.0 g of triethylamine dissolved by 3.0 g of tetrahydrofuran is added dropwise to the mixture over 10 minutes and then the mixture is stirred at 25 degrees Celsius for 3 hours. The mixture is then further stirred after addition of water and then extracted with 28 g ethyl acetate and the organic phase is washed with water. Thereafter, ethyl acetate is distilled away, and the resultants are purified by silica gel column chromatography (ethyl acetate:hexane=2:8), thereby obtaining 2.96 g of 2,4-dimethoxy-4'-(2-methacryloxyethoxy)-benzophenone.

Synthesis of (2,4-dimethoxyphenyl)-[4-(2-methacryloxyethoxy]-phenyl]-dimethoxymethane (Example 2)

2.8 g of 2,4-dimethoxy-4'-(2-methacryloxyethoxy)-benzophenone, 0.05 g bismuth (III) trifluoromethanesulfonate and 5.2 g of trimethyl orthofomate are dissolved in 7.0 g of methanol. The mixture is stirred at reflux temperature for 72 hours, after which the mixture is cooled to 25 degrees Celsius, further stirred after addition of a 5% aqueous NaHCO₃ solution, and then extracted with 30 g ethyl acetate and the organic phase is washed with water. Thereafter, ethyl acetate is distilled away and the resultants are purified by silica gel column chromatography (ethyl acetate:hexane=1:9), thereby obtaining 1.92 g of (2,4-dimethoxyphenyl)-[4-(2-methacryloxyethoxy)-phenyl]-dimethoxymethane.

(3)

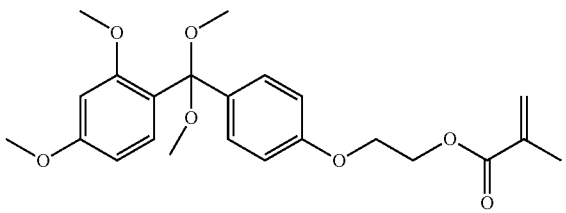

Example 2

A solution containing 5.0 g of α-methacryloyloxy-γ-butylolactone, 6.03 g of 2-methyladamantane-2-methacrylate, and 4.34 g of 3-hydroxyadamantane-1-methacrylate, 0.51 g of dimethyl-2,2'-azobis(2-methylpropionate)3-hydrocyadamantane-1-methacrylate, and 26.1 of tetrahydrofuran is prepared. The prepared solution is added for 4 hours to 20.0 g of tetrahydrofuran placed in a flask while stirring and boiling. After the addition of the prepared solution, the mixture is heated to reflux for 2 hours and cooled to room temperature. Addition of the mixture by drops to a mixed liquid containing 160 g of hexane and 18 g of tetrahydrofuran while vigorously stirring, precipitating the copolymer. The copolymer is isolated by filtration. Purification of the copolymer is carried out by vacuum drying following two washings by 70 g of hexane, thereby obtaining 8.5 g of white powder of the copolymer.

(4)

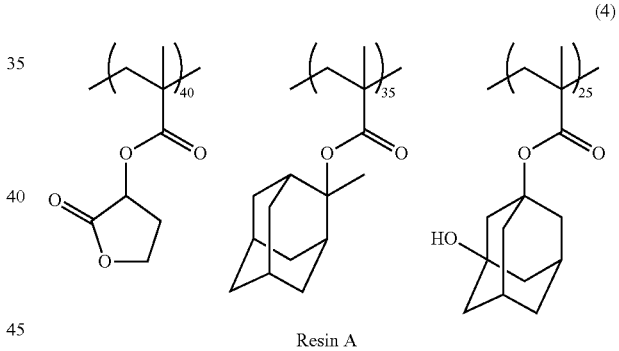

Resin A

A solution containing 0.82 g of (2,4-dimethoxyphenyl)-[4-(2-methacryloxy-ethoxy)-phenyl]-dimetoxymethane, 3.0 g of α-methacryloyloxy-γ-butylolactone, 2.6 g of 2-methyladamantane-2-methacrylate, 3.1 g of 3-hydroxyadamantane-1-methacrylate, 0.51 g of dimethyl-2,2'-azobis(2-methylpropionate) and 11.2 g of tetrahydrofuran is prepared. 0.2 g of butyl mercaptane is added to the solution because a corresponding radical generated from butyl mercaptane during the reaction of the solution adjusts the chain length of the polymer to be generated. The prepared solution is added dropwise for 4 hours to 8.0 g of tetrahydrofuran placed in flask while stirring and boiling. After the addition of the prepared solution, the mixture is heated to reflux for 2 hours and cooled to room temperature. Addition of the mixture by drops to a mixed liquid containing 110 g of hexane and 11 g of tetrahydrofuran while vigorously stirring, precipitating the copolymer. The copolymer is isolated by filtration. Purification of the copolymer is carried out by vacuum drying following two washings by 40 g of hexane, thereby obtaining 6.9 g of white powder of the copolymer (Resin B).

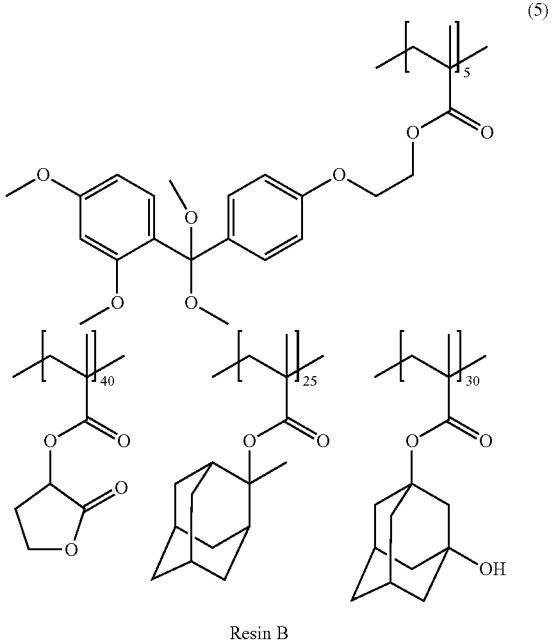

Resin B

Preparation of Samples for Evaluation (the "Evaluation Sample")

The Evaluation Sample 1 is prepared by dissolving 23.5 mg of (2,4-dimethoxyphenyl)-(4'-methoxyphenyl)-methanol, 600 mg of resin A and 24.9 mg of diphenyliodonium nonafluorobutanesulfonate as a photoacid generator (PAG) in 8000 mg of cyclohexane, while Evaluation Sample 2 is prepared by dissolving 600 mg of Resin B and 24.9 mg of diphenyliodonium nonafluorobutanesulfonate in 8000 mg of cyclohexanone.

Evaluation of Sensitivity

Before applying the Evaluation Samples to Si wafers, hexamethyldisilazane (HMDS, Tokyo Chemical Industry) is spin-coated at 2000 rpm for 20 seconds on the surfaces of Si wafers and baked at 110 degrees Celsius for 1 minute. Then, the Evaluation Samples are spin-coated on the surfaces of Si wafers that have been treated with HMDS at 2000 rpm for 20 seconds to form coating films. The prebake of the coating films are performed at 110 degrees Celsius for 60 seconds. Then, the coating films of the Evaluation Samples are exposed to an electron beam (EB) output from an EB radiation source. After the EB exposures, irradiations of the coating films with a UV light are carried out at an ambient condition. After the UV light exposures, a post-exposure bake (PEB) is carried out at 100 degrees Celsius for 60 seconds. The coating films are developed with NMD-3 (tetra-methyl ammonium hydroxide 2.38%, Tokyo Ohka Kogyo) for 60 seconds at 25 degrees Celsius and rinsed with deionized water for 10 seconds. Using a film thickness measurement tool, the thickness of the coating films measured approximately 150 nm.

A sensitivity ($E_0$ sensitivity) is evaluated by measuring the total doses to form a pattern constituted by 2-μm lines where the thickness of the coating film is not zero and 2-μm spaces where the thickness of the coating film is zero using an EB radiation source and a UV light source (bright line is mainly from 320 nm to 380 nm).

Even if the UV exposure using the UV light source is carried out without a mask, 2-μm spaces are formed in the parts of the coating films that have been exposed to the EB. This indicates that ketone compounds resulting from reactions of the acetal compounds with acid generated from PAGs by irradiations of the coating films function as photosensitizers for the UV exposures.

Table 1 shows the total doses corresponding to $E_0$ sensitivities measured for the Evaluation Samples 1 to 4. Table 1 indicates that the doses of the UV exposure for $E_0$ sensitivity decreases with increase of the doses of the EB exposure.

TABLE 1

The doses for $E_0$ light by an EB and UV exposure for the Evaluation Samples

| | Total dose for $E_0$ | |
|---|---|---|
| | EB dose [μC/cm$^2$] | UV dose [mJ/cm$^2$] |
| Example 1 | 20 | 0 |
| | 17.5 | 560 |
| | 13.8 | 1100 |
| | 8.8 | 3350 |
| Example 2 | 20 | 0 |
| | 13.8 | 560 |
| | 8.8 | 1100 |
| | 3.8 | 3350 |

Each of Examples 3, 4, and 5 are also preferably used as precursors of photosensitizers for light exposures following an EUV or EB exposure. Each of the Examples is converted into a corresponding ketone that can function as a photosensitizer for the light exposures.

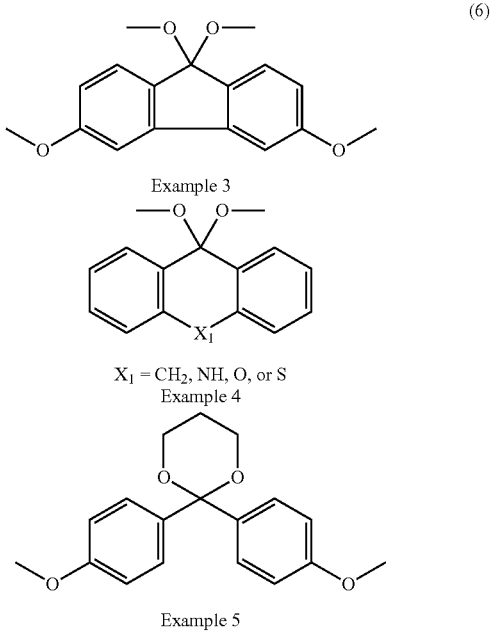

Example 3

$X_1 = CH_2$, NH, O, or S

Example 4

Example 5

Examples 1 and 3-5 are precursors for Acid Generation Enhancers (AGEs), which enhance acid generation by photosensitization. Polymers having main moieties including acetal parts and pi-conjugated system of Examples 3-5 are also utilized for precursors of AGEs, which enhance acid generation by photosensitization. A photoresist including Example 1 and 3-5 as precursors of sensitizers can be applied to fabrication processes of a device such as an integrated circuit (IC).

A solution of a chemically amplified composition (CAR) including a precursor for an AGE, resin A, and a PAG is applied to the surface of an Si wafer by spin coating to form a coating film. The coating film is prebaked.

An irradiation of the coating film with an EUV light through a mask or exposures of the coating film to EB is carried out after prebake of the Si wafers The deprotection reaction of the precursor for the AGE is induced by acid generated by photoreaction of the PAG to form the AGE.

After the EUV or EB exposure of the coating film, an irradiation of the coating film with a light with a wavelength equal to or longer than 200 nm is carried out, typically, a light with a wavelength equal to or longer than 300 nm. The AGE acts as photosensitizer for the generation of acid from the PAG.

Development of the coating film that has been irradiated with the light exposure following the EUV or EB exposure is performed after a post-exposure bake (PEB).

The coating film and the silicon wafer are exposed to plasma. After that, the remaining film is removed. In such manner, patterning for fabricating a device is carried out and the device is fabricated. A ketone compound acting as a photosensitizer is also protected by a protective group such as an acyclic or cyclic acetal group, an acyclic or cyclic dithio acetal, or an acyclic or cyclic monothio acetal group.

A precursor for an AGE can be bound to a polymer chain. Concretely, at least each of a mother moiety of the precursor can be a polymer chain through ether group or ester group like Example 2 to be described.

FIG. 1 shows fabrication processes of a device such as an integrated circuit (IC) using a photoresist including the acid generation enhancer (AGE) obtained by the processes by the above procedures.

A silicon wafer is provided. The surface of the silicon wafer is oxidized by heating the silicon wafer in the presence of oxygen gas.

A solution of a chemically amplified composition (CAR) including an AGE, resin A, and a PAG is applied to the surface of an Si wafer by spin coating to form a coating film. The coating film is prebaked.

An irradiation of the coating film with an EUV light through a mask is carried out after prebake of the Si wafer. The deprotection reaction of resin A is induced by acid generated by photoreaction of the photoacid generator and assistance by AGE.

After the EUV irradiation of the coating film, an irradiation of the coating film with a light of which wavelength is equal to or longer than 300 nm is carried out.

Development of the coating film that has been irradiated with the EUV light with the light, which wavelength is equal to or longer than 300 nm, being performed after the prebake.

The coating film and the silicon wafer are exposed to plasma. After that, the remaining film is removed.

An electronic device such as an integrated circuit is fabricated utilizing the processes shown in FIG. 1. The deterioration of the device due to the irradiation with a light is suppressed compared to existing photoresists since times for irradiation of the coating film is shortened.

The invention claimed is:

1. A composition, comprising:
a resin being able to react with a first chemical species to cause a deprotection reaction of the resin; and
a precursor being a photoacid generator; and
a reagent that generates a product that enhances a generation of the first chemical species from the precursor by a first reaction of the precursor, the reagent being represented by formula (I),

where:
$R^1$ is a pi-conjugated system, which may be substituted by at least one electron donating group;
$R^2$ is selected from the group consisting of a hydrogen atom, a phenyl group, which may be substituted by at least one electron donating group, an alkyl group, an alkenyl group, an alkynyl group, and an alkyl group containing a cyclic or polycyclic moiety;
each of $R^3$ and $R^4$ is selected from the group consisting of an alkyl group, an alkenyl group, an aralkyl group, an alkynyl group, and an alkyl group containing a cyclic or poly cyclic moiety;
$R^3$ is not connected to $R^4$; and
Y is an oxygen atom or sulfur atom.

2. The composition according to claim 1, wherein the first chemical species is acid.

3. The composition according to claim 1, wherein:
the product enhances the generation of the first chemical species from the precursor by absorbing a first light of which wavelength is a first wavelength and acting as a sensitizer; and
the precursor generates a second chemical species by absorbing a second light of which wavelength is equal to or shorter than 50 nm.

4. The composition of claim 3, wherein a first wavelength of the first light is longer than or equal to 300 nm.

5. The composition according to claim 1, wherein the resin has a molecular weight greater than 2000.

6. The composition according to claim 1, wherein the product is formed by a deprotection reaction of the reagent.

7. The composition of claim 1, wherein:
the product enhances the generation of the first chemical species from the precursor by absorbing a first light having a first wavelength and acting as a sensitizer; and
the precursor generates a second chemical species by absorbing a second light, the wavelength of which is shorter than or equal to 50 nm.

8. The composition of claim 7, wherein the first wavelength is longer than or equal to 300 nm.

9. The composition according to claim 1, wherein:
at least one of $R^1$ and $R^2$ is a phenyl group, which is substituted by at least one electron donating group selected from the group consisting of an alkyl group, an alkoxy group, an alkyl amino group, hydroxy group, and an alkyl thio group.

10. The composition of claim 1, wherein the pi-conjugated system is an aromatic ring.

11. A method for manufacturing a device, the method comprising:
applying a solution of the composition according to claim 1 to a substrate such that a coating film including the composition is formed on the substrate; and
a first irradiation of the coating film with at least one of an extreme ultraviolet light and an electron beam such that a first portion of the coating film is irradiated with the at least one of the extreme ultraviolet light and/or the electron beam while a second portion of the coating film is not irradiated with the at least one of the extreme ultraviolet light and/or the electron beam;

a second irradiation of the coating film with at least one of a UV light and a visible light;
removing the first portion of the coating film; and
etching the substrate such that a third portion of the substrate on which the first portion has been present is etched.

12. A composition comprising:
a precursor being a photoacid generator; and
a polymer including a polymer chain and a reagent part bonded to the polymer chain,
wherein the reagent part generates a product that enhances a generation of a first chemical species from the precursor by a first reaction of the precursor; and
the reagent part is represented by formula (I),

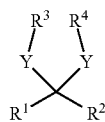

(1)

where:
R¹ is a phenyl group, which may be substituted by an electron donating group;
R² is selected from the group consisting of a hydrogen atom, a phenyl group which may be substituted by at least one electron donating group, an alkyl group, an alkenyl group, an alkynyl group, and an alkyl group containing a cyclic or polycyclic moiety;
each of R³ and R⁴ is selected from the group consisting of an alkyl group, an alkenyl group, an aralkyl group, an alkynyl group, and an alkyl group containing a cyclic or poly cyclic moiety;
Y is an oxygen atom or a sulfur atom;
R³ is not connected to R⁴; and
the reagent part is bonded to the polymer chain via an ether group or an ester group to the phenyl group of R¹.

13. The composition of claim 12, wherein:
the product enhances the generation of the first chemical species from the precursor by absorbing a first light having a first wavelength and acting as a sensitizer; and
the precursor generates a second chemical species by absorbing a second light, the wavelength of which is shorter than or equal to 50 nm.

14. The composition according to claim 12, wherein:
at least one of R¹ and R² is a phenyl group, which is substituted by at least one electron donating group selected from the group consisting of an alkyl group, an alkoxy group, an alkyl amino group, hydroxy group, and an alkyl thio group.

15. The composition of claim 12, wherein the pi-conjugated system is an aromatic ring.

16. A method for manufacturing a device, the method comprising:
applying a solution of a composition to a substrate such that a coating film including a composition is formed on the substrate; and a first irradiation of the coating film with at least one of an extreme ultraviolet light and an electron beam such that a first portion of the coating film is irradiated with the at least one of the extreme ultraviolet light and/or the electron beam while a second portion of the coating film is not irradiated with the at least one of the extreme ultraviolet light and/or the electron beam;
a second irradiation of the coating film with at least one of a UV light and a visible light;
removing the first portion of the coating film; and
etching the substrate such that a third portion of the substrate on which the first portion has been present is etched, wherein
the composition includes:
a resin able to react with a first chemical species to cause a deprotection reaction of the resin;
a precursor being a photoacid generator; and
a reagent that generates a product that enhances a generation of the first chemical species from the precursor by a first reaction of the precursor, the reagent being represented by formula (I),

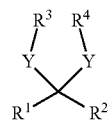

(1)

where:
R¹ is a pi-conjugated system, which may be substituted by an electron donating group;
R² is selected from the group consisting of a hydrogen atom, a phenyl group which may be substituted by an electron donating group, an alkyl group, an alkenyl group, an alkynyl group, and an alkyl group containing a cyclic or polycyclic moiety;
each of R³ and R⁴ is selected from the group consisting of an alkyl group, an alkenyl group, an aralkyl group, an alkynyl group, and an alkyl group containing a cyclic or poly cyclic moiety; and
Y is an oxygen atom or a sulfur atom.

17. The method according to claim 16, wherein the reagent part includes a group selected from the group consisting of an acyclic or cyclic acetal group, an acyclic or cyclic dithio acetal group, and an acyclic or cyclic monothio acetal group.

18. The method according to claim 16, wherein:
at least one of R¹ and R² is a phenyl group, which is substituted by at least one electron donating group selected from the group consisting of an alkyl group, an alkoxy group, an alkyl amino group, hydroxy group, and an alkyl thio group.

19. The method according to claim 16, wherein the pi-conjugated system is an aromatic ring.

* * * * *